United States Patent
Watanabe et al.

(10) Patent No.: US 6,664,125 B2
(45) Date of Patent: Dec. 16, 2003

(54) SOLID-STATE IMAGE PICKUP DEVICE AND A METHOD OF MANUFACTURING THE SAME

(75) Inventors: Eiji Watanabe, Miyagi (JP); Takeshi Nishida, Miyagi (JP)

(73) Assignee: Fuji Photo Film Co., Ltd., Minami-ashigara (JP)

( * ) Notice: Subject to any disclaimer, the term of this patent is extended or adjusted under 35 U.S.C. 154(b) by 171 days.

(21) Appl. No.: 09/781,217

(22) Filed: Feb. 13, 2001

(65) Prior Publication Data

US 2001/0017405 A1 Aug. 30, 2001

(30) Foreign Application Priority Data

Feb. 29, 2000 (JP) ........................................ 2000-054551

(51) Int. Cl.$^7$ ............................................... H01L 21/00
(52) U.S. Cl. ........................... 438/26; 438/116; 438/118
(58) Field of Search ............................. 438/25, 26, 64, 438/110, 116, 118, 125

(56) References Cited

U.S. PATENT DOCUMENTS 5,423,889 A * 6/1995 Colquitt et al. ............. 156/295
6,069,027 A * 5/2000 Mertol et al. ............... 438/106
6,255,140 B1 * 7/2001 Wang .......................... 438/108
6,352,875 B1 * 3/2002 Hayashi et al. ............. 136/244

* cited by examiner

Primary Examiner—Amir Zarabian
Assistant Examiner—Jamie L. Brophy
(74) Attorney, Agent, or Firm—Arent Fox Kintner Plotkin & Kahn, PLLC

(57) ABSTRACT

A method of manufacturing a solid-state image pickup device including the steps of preparing a package including a housing section to house a solid-state image pickup element chip and an opening section in an upper section thereof, sporadically applying adhesive with a predetermined thickness on a bottom surface of the housing section, moving the solid-state image pickup element toward the housing section, an upper surface of the package and an upper surface of the element each having desired parallelism with respect to a predetermined reference surface with high precision, bringing a rear surface of the solid-state image pickup element into contact with the adhesive and stopping the movement of the element before the element comes into contact with the bottom surface of the housing section, curing the adhesive while the solid-state image pickup element is floating on the adhesive and fixing the element in the housing section. Fluctuation of resolution of the solid-state image pickup device is minimized in a light receiving plane of the element.

14 Claims, 10 Drawing Sheets

SOLID-STATE IMAGE PICKUP DEVICE AND A METHOD OF MANUFACTURING THE SAME

This application is based on the Japanese Patent Application 2000-054551, filed on Feb. 29, 2000, all the content of which is incorporated herein by reference.

BACKGROUND OF THE INVENTION

1. Field of the Invention

The present invention relates to a solid-state image pickup device and a method of manufacturing the same, and in particular, to a solid-state image pickup device and a method of manufacturing the same in which a solid-state image pickup element is attached to a package with high precision.

2. Description of the Related Art

With an increasing need of higher picture quality for a digital video camera of integrated type and a digital still camera, research and development of a solid-state image pickup element for use with a solid-state image pickup device have been carried out for fine structure and high integration thereof. A need for an optical system is also highly increased, namely, an image must exactly focused on an image-pickup plane of the solid-state image pickup element.

FIG. 8 shows a general configuration of a solid-state image pickup device in a cross section.

In FIG. 8, a solid-state image pickup device X includes a package 101 in a contour of a box and a solid-state image pickup element 103 housed in the package 101.

As can be seen from FIG. 8, the package 101 includes a bottom plate 101a and a sidewall section 101b rising from a peripheral section of the bottom plate 101a. The configuration defines an opening section 101c formed in an upper section of the package 101 and a housing section 101d surrounded by the bottom plate 101a and the side wall section 101b to house the image pickup element 103.

The image pickup element 103 is installed in the housing section 101d. The image pickup element 103 is connected via bonding wires 107 to lead wires of the package 101.

The opening section 101c of the package 101 is covered with a transparent shield plate 111 placed on an upper surface 101e of the side wall section 101b.

The solid-state image pickup device 103 ha a rear surface fixedly attached to the housing section 101d by adhesive 115.

FIG. 9 is a cross-sectional view to explain a method of manufacturing a solid-state image pickup device.

As shown in FIG. 9, a package 101 on a carrier 123 is transported (to a predetermined position). The carrier 123 has an opening below the package 101.

A package stage 121 made of iron-based material is moved upward through the opening to mount the package 101 on the stage 121. The stage 121 has a stage adsorbing hole 121a to fix the package 101 on the stage 121. The hole 121a produces a state like vacuum by sucking air to adsorb the rear surface of the package 101 on the package stage 121.

The housing section 101d of the package 101 is coated with adhesive 115. In the state, the solid-state image pickup element 103 is supported by a collet 125 and is placed at a predetermined position in the housing section 101d.

The collet 125 has an adsorbing hole 125a which adsorbs the solid-state image pickup element 103 to fixedly support the element 103. The collet 125 with the element 103 is moved downward to be pressed against the adhesive 115 to install the solid-state image pickup element 103 on the housing section 101d of the package 101. The adhesive 115 between the element 103 and the package 101 is cured or hardened by heat to fix the element 103 in the package 101.

After a wire bonding process is conducted for the objective item, the upper opening section of the package 101 is covered by a shield plate to completely manufacture a solid-state image pickup device.

FIG. 10 shows in a schematic cross-sectional view a configuration of an image pickup device including a solid-state image pickup device and an optical system including a lens.

As shown in FIG. 10, an image pickup device Y includes a solid-state image pickup device X, a solid-state image pickup device fixing member 131, an image pickup lens body tube 133, and an image pickup lens 135.

The fixing member 131 supports a bottom surface of the package 101. The lens body tube 133 in a cylindrical shape is formed on a peripheral edge section of the fixing member 131. On an inner circumferential section 133a of the body tube 133, an upper engaging section 133b and a lower engaging section 133c are formed to support the image pickup lens 135. The upper and lower engaging section 133b and 133c fixedly support the lens 135.

As the adhesive to fix the solid-state image pickup element on the package, there has been used thermosetting adhesive such as silver paste or resin-based adhesive. The silver paste has a high reflection factor for light and is therefore not suitable as adhesive for a solid-state image pickup element. Consequently, resin-based adhesive has been increasingly used.

However, in a solid-state image pickup device including photo diodes in a fine structure, there arises a problem that resolution of the solid-state image pickup device deviates or fluctuates within a chip area of a solid-state image pickup device.

To increase picture quality of a digital video camera of integrated type and a digital still camera, only miniaturizing structure of photo diodes and the like is insufficient. To improve picture quality of a camera or the like, it is essential how to exactly adjust focus of an image pickup lens of a camera onto a light receiving plane of each photo diode formed in fine structure.

For this purpose, it is required to improve precision of tilt of image in a light receiving plane (parallelism of the light receiving plane with respect to the optical system).

SUMMARY OF THE INVENTION

It is therefore an object of the present invention to provide a technique to reduce fluctuation of the tilt angle of image in a solid-state image pickup element to increase picture quality of a camera or the like using the element.

According to one aspect of the present invention, there is provided a method of manufacturing a solid-state image pickup device comprising the steps of preparing a package including a housing section to house a solid-state image pickup element chip and an opening section in an upper section thereof, sporadically applying adhesive with a predetermined thickness on a bottom surface of the housing section, moving the solid-state image pickup element toward the housing section, an upper surface of the package and an upper surface of the element each having desired parallelism with respect to a predetermined reference surface with high precision, bringing a rear surface of the solid-state image pickup element into contact with the adhesive and stopping the movement of the element before the element comes into contact with the bottom surface of the housing section, and curing the adhesive while the solid-state image pickup element is floating on the adhesive and fixing the element in the housing section.

According to the present invention, there is provided a method of manufacturing a solid-state image pickup device, comprising the steps of preparing a package including a bottom plate and a side wall rising from the bottom plate to house a solid-state image pickup element chip, sporadically applying adhesive with a predetermined thickness on the bottom plate of the package, setting an upper surface of the side wall or an upper surface of the bottom plate as a reference plane, bringing a rear surface of the solid-state image pickup element into contact with the adhesive with parallelism adjusted with high precision between the upper surface of the element and the reference plane, moving the solid-state image pickup element, the rear surface of the element depressing the adhesive, the rear surface of the element not coming into contact with the upper surface of the bottom plate and curing the adhesive and fixing the solid-state image pickup element in the package.

According to the present invention, there is provided a package comprising a bottom plate, a side wall rising from said bottom plate, a housing section for hosing a solid-state image pickup element chip, an opening section in an upper section of the package, and a projection projecting outward from said side wall, said projection including a flat upper surface.

According to the present invention, there is provided a solid-state image pickup device comprising a package including a bottom plate, a side wall rising from said bottom plate, a housing section for hosing a solid-state image pickup element chip, and an opening section in an upper section thereof; adhesive with a predetermined width sporadically applied on said bottom plate, a solid-state image pickup element including a rear surface supported on the adhesive and being fixed thereon, said element being floating over a surface of said bottom plate; and a transparent shield plate for closing said opening section.

In the solid-state image pickup element, the fluctuation of resolution in the light receiving plane is reduced. This increases the picture quality of image pickup devices such as a camera using the element.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
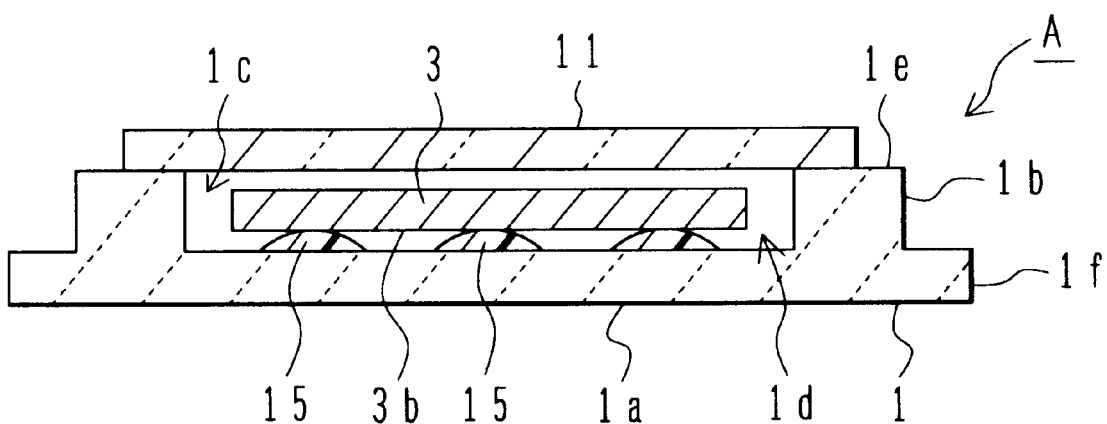
FIG. 1 is a cross-sectional view showing an embodiment of a solid-state image pickup device according to the present invention.

The inventor gave consideration to a problem in which when resin-based adhesive is used in a solid-state image pickup device including a solid-state image pickup element and recent photo diodes in a fine structure, resolution of the solid-state image pickup element fluctuates in a light receiving plane of the element.

The inventor resultantly recognized that the fluctuation of resolution of the solid-state image pickup element chip takes place by two causes associated with viscosity of the adhesive.

The first cause resides in that when a resin of the adhesive has a low viscosity, the rear surface of the chip is brought into contact with the surface of the housing section of the package (surface contact). Therefore, depending on precision of dimensions of the package, the solid-state image pickup element itself inclines relative to a reference plane of the optical system depending on cases.

To increase precision of parts of the package, it is favorable to use packages made of a plastic. However, to produce a plastic package, an expensive metal mold is required. This leads to a problem of increase in the production cost. To manufacture a ceramic package, a high-temperature baking process is required and hence there arises a problem with respect to improvement of precision of parts.

When a ceramic package is used and the adhesive has a high viscosity, the adhesive is likely to have a rough surface with higher raised portions. As a result, the solid-state image pickup element inclines relative to the reference plane of the optical system.

The inventor has devised a solution according to the consideration. As a reference plane in the process to fix the solid-state image pickup element onto the package, a reference plane equal to the reference place of the optical system, namely, an upper surface of the package is used. Resultantly, an equal reference plane is used for the optical system, for example, a lens and the solid-state image pickup element.

Next, to cope with a ceramic package with a low precision of parts, adhesive based on resin having a high viscosity is used. When adhesive with a high viscosity is applied onto a surface of the housing section corresponding to an entire rear surface of the solid-state image pickup element chip, bubbles appear in thermal treatment to cure the resin. The solid-state image pickup element resultantly is partly raised by the bubbles.

The bubbles take place due to change in solubility of air or the like in the resin-based adhesive during the heating process or the like.

To solve the difficulty, the adhesive is not applied onto the surface of the housing section corresponding to the entire rear surface of the solid-state image pickup element chip, but is sporadically applied onto the pertinent surface. The areas or sections applied with the adhesive are discontinuous. Therefore, even when the housing section corresponding to an entire rear surface of the solid-state image pickup element is pushed onto the adhesive, the adhesive spreads well in the rear surface of the chip, not go to the outside of the chip. Even bubbles take place, gas thereof can easily come out of the adhesive.

According to the consideration, description will be given of an embodiment by referring to the drawings.

Referring now to FIGS. 1 to 5, description will be given of a first embodiment of a solid-state image pickup device.

FIG. 1 shows constitution of the embodiment, i.e., a solid-state image pickup device A, in a cross-sectional view.

The solid-state image pickup device A includes a ceramic package 1 in a shape of a box and a solid-state image pickup element 3 housed in the package 1.

The package 1 has a contour of a box including a bottom plate 1a and a side wall section 1b rising from a peripheral edge section of the bottom plate 1a. An opening section 1c exists in an upper section of the package 1 to form a housing section 1d which is a space surrounded by the bottom plate 1a and the side wall section 1b. In the external circumferential section of the side-wall section 1b, the package 1 has a projected section 1f projecting in an outward direction and substantially parallel to the bottom plate 1a.

The solid-state image pickup element 3 is housed in the housing section 1d.

The opening section 1c of the package 1 is covered with a transparent shield plate 11 placed on an upper surface of the side wall section 1b.

The element 3 has a rear surface 3b fixed onto a surface of the bottom plate 1a by adhesive 15.

More precisely, the rear surface 3b of the element 3 is not brought into contact with the surface of the bottom plate 1a, but is placed in a floating state over the bottom plate 1a with a gap of the adhesive 15 therebetween. The gap between the rear surface 3b and the surface of the bottom plate 1a varies depending on manufacturing precision of the package. However, the gap favorably has a minimum length of about 40 micrometers ($\mu$m) or less.

Figure 2A:
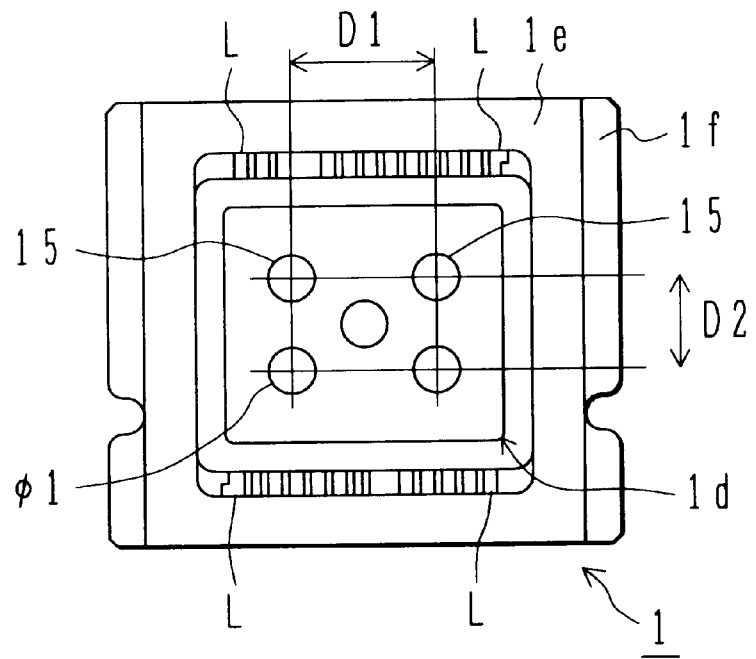
FIGS. 2A and 2B are plan views showing an embodiment of a solid-state image pickup device according to the present invention.
Figure 2B:
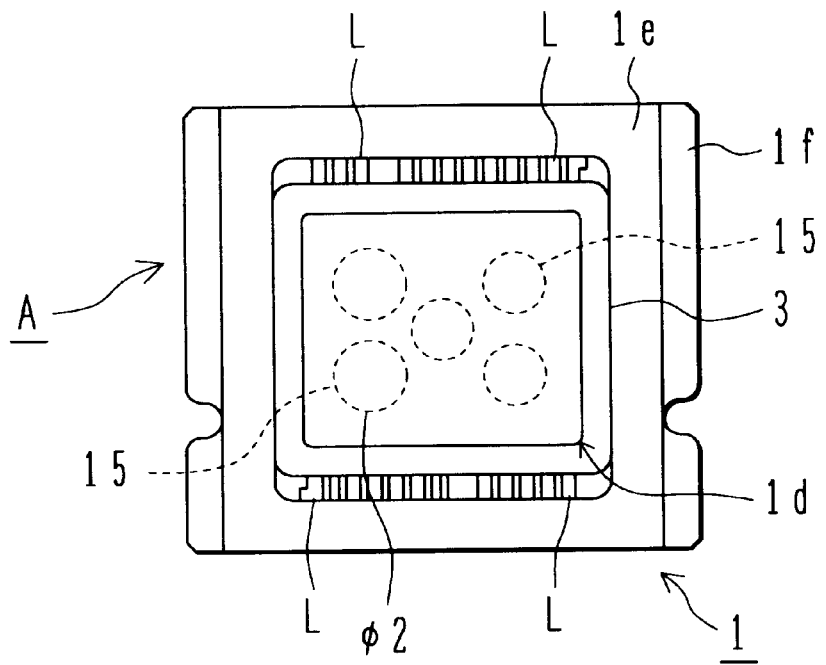

FIGS. 2A and 2B particularly show, in schematic plan views, a state of the adhesive 15 between the rear surface 3b and the surface of the bottom plate 1a in the solid-state image pickup device A.

FIG. 2A shows a state of the adhesive 15 applied between the rear surface 3b and the surface of the bottom plate 1a and FIG. 2B shows a state in which a solid-state image pickup device is placed on the adhesive 15.

As shown in FIG. 2A, the package 1 for the solid-state image pickup element is in a rectangular form of, for example, 17.4 millimeters (mm) by 15 mm and has a planarity of about 50 $\mu$m. That is, the package may incline about 50 $\mu$m with respect to a reference surface or there may exist some projections and depressions.

The projection 1f is formed on both side sections (in the horizontal direction of FIG. 2A) of the package 1. On the remaining both side sections (in the vertical direction of FIG. 2A), a lead L is formed.

The adhesive is sporadically applied to five circular places, namely, almost a central place of the housing section 1d and four peripheral places surrounding the central place in association with the contour of the solid-state image pickup element. The adhesive has a viscosity of 14 Pa·s. The adhesive desirably has a viscosity ranging from 5 Pa·s to 25 Pa·s. The adhesive applying place or area has a contour, for example, a circular contour with a diameter $\phi$ 1 ranging from about 1 mm to about 2 mm.

The adhesive 15 has a thickness of, for example, from about 0.1 mm to about 0.3 mm. The adhesive 15 is sporadically applied to the surface by an adhesive dispenser having five nozzles. The adhesive 15 has particular viscosity. In the adhesive applying process, when the adhesive 15 is cut off in a direction vertical to the adhesive applying surface, the adhesive has an upward concave form. Distance D1 between two horizontally arranged adhesive positions ranges, for example, for 4 mm to 6 mm. Distance D2 between two vertically arranged adhesive positions ranges, for example, for 2.5 mm to 4.5 mm.

The solid-state image pickup element 3 is a rectangular shape of 9.4 mm by 7.8 mm and has a thickness of 0.65 mm.

As can be seen from FIG. 2B, when the adhesive 15 is depressed by the rear surface of the solid-state image pickup element, the adhesive 15 is expanded. The expanded adhesive 15 has a diameter $\phi$ 1 ranging from about 1.5 mm to about 3.5 mm.

In this specification, "the adhesive is sporadically applied" implies a state in which the adhesive is applied to positions which are separated from each other on a plane. The state includes not only a state in which the adhesive is applied in a pattern aligned on a plane but also a state in which the adhesive is applies to positions defined on a plane at random.

Figure 3A:
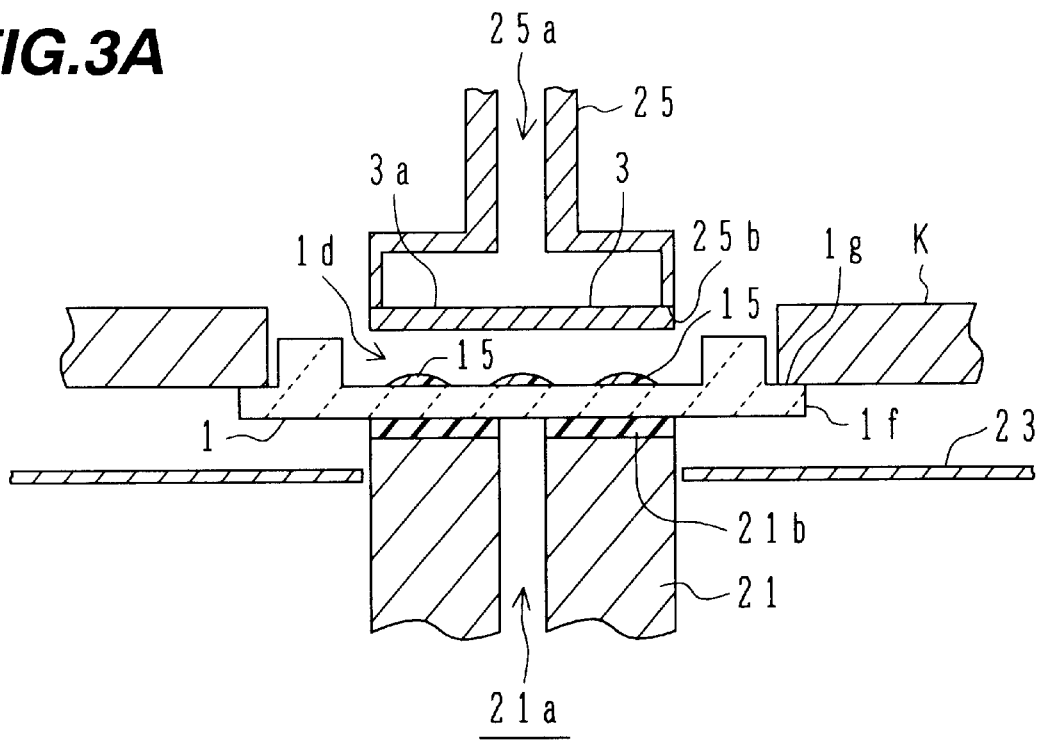
FIGS. 3A and 3B are cross-sectional views to explain an apparatus for and a method of manufacturing a solid-state image pickup device in an embodiment according to the present invention.
Figure 3B:
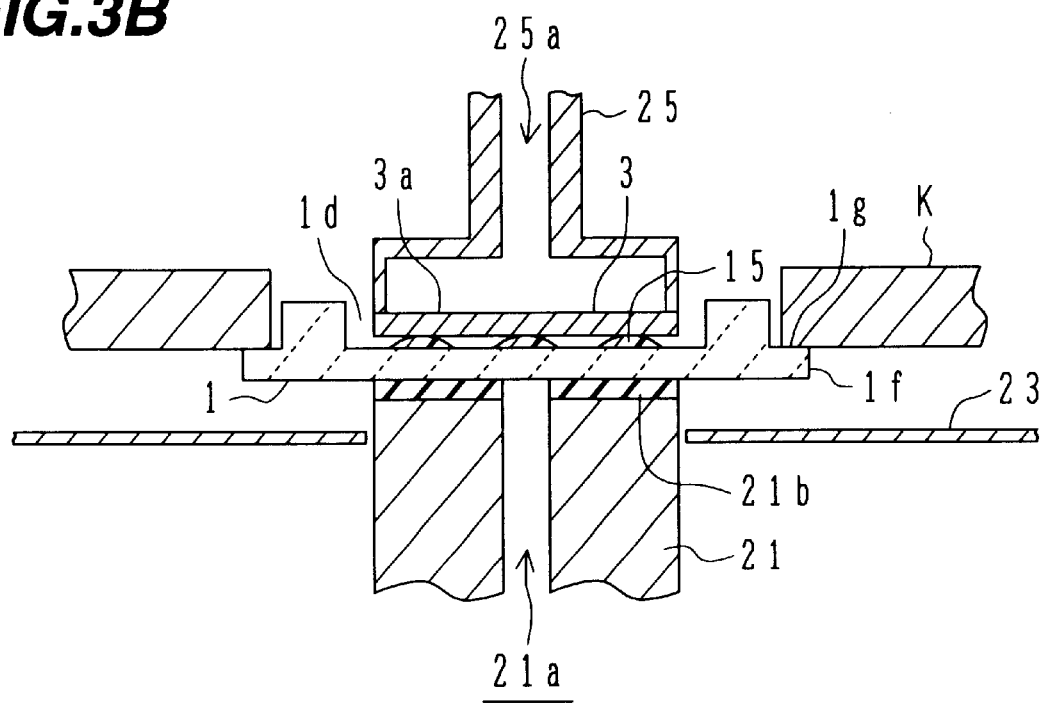

FIGS. 3A and 3B are cross-sectional views to explain an apparatus for and a method of manufacturing the solid-state image pickup device A.

As shown in FIG. 3A, the carrier 23 carries the package 1 to a predetermined location. Actually, a plurality of packages are installed on the carrier 23. On a position at which the package is mounted on the carrier 23, an opening section is disposed.

The carrier 23 is moved so that the package 1 is placed on a package stage 21 made of iron-based material. The stage 21 moves upward through the opening section to lift the package 1 upward.

In the package stage 21, a suction hole 21a is arranged for sucking the package 1 to thereby fixedly support the package 1 on the stage 21.

By evacuating air from the suction hole 21a, the package 1 is adsorbed sucked and kept supported on the stage 21. The stage 21 has an elastic member 21b in an upper section thereof, the member 21b being made of heat resistive lubber or the like. The elastic member 21b makes it possible to achieve fine adjustment of the position of the package 1 on the stage 21 to a particular extent.

To define the parallelism of the package 1, an upper reference member K is disposed. By bringing an upper surface 1g of the projection 1f of the package 1 into contact with a rear surface of the member K, the parallelism of the package 1 is defined.

An end edge surface 25b of a collet 25 is in contact with a peripheral section of a surface 3a of the solid-state image pickup element 3. The collet 25 has an adsorbing hole 25a therein and adsorbs the solid-state image pickup device 3 to hold the device 3 on the collet 25.

The parallelism between the rear surface of the upper surface reference member k and the end edge surface 25b of the collet 25 is kept retained with quite high precision. The parallelism is kept unchanged, for example, as follows. A calibration plate with quite high parallelism (between an upper surface and a rear surface thereof) is prepared for the package. A sheet of pressure sensitive paper is sandwiched between the calibration plate and the collet. By moving the collet downward to adjust a positional relationship between the rear surface of the member K and the end edge surface 25b of the collet 25 such that the sheet of pressure sensitive paper uniformly senses pressure in its plane. Alternatively, the parallelism may be adjusted by an auto-collimator.

As can be seen from FIG. 3B, the solid-state image pickup element 3 held by the collet 25 is moved downward to be brought into contact with the end edge section of the adhesive 15 at each position. When the element 3 is further moved downward, the adhesive 15 is depressed. The downward movement of the element 3 is then stopped before the rear surface of the element 3 comes into contact with the surface of the package 1.

The parallelism of the solid-state image pickup element 3 is defined by that of the upper surface reference member K regardless of the parallelism of the bottom plate 1a of the package 1. Therefore, the element 3 can be installed in the housing section 1d of the package 1 with high parallelism between the element 3 and the reference member K.

Since an elastic member made of lubber or the like is used in an upper section (to be brought into contact with the bottom plate of the package) of the package stage, even when the rear surface of the package is distorted to some extent, the parallelism can be suitably kept retained between the upper surface 1g of the package and the reference member K.

Since the adhesive 15 has particular viscosity, even when the collet 25 is removed, the element 3 is installed in the housing section 1d of the package 1 with parallelism substantially equal to that of the state in which the element 3 is held by the collet 25. Since the adhesive 15 is sporadically applied on the surface, air can easily come from the bubbles to the outside. This consequently minimizes occurrence of the event in which the element 3 is partly raised by the adhesive.

Figure 4A:
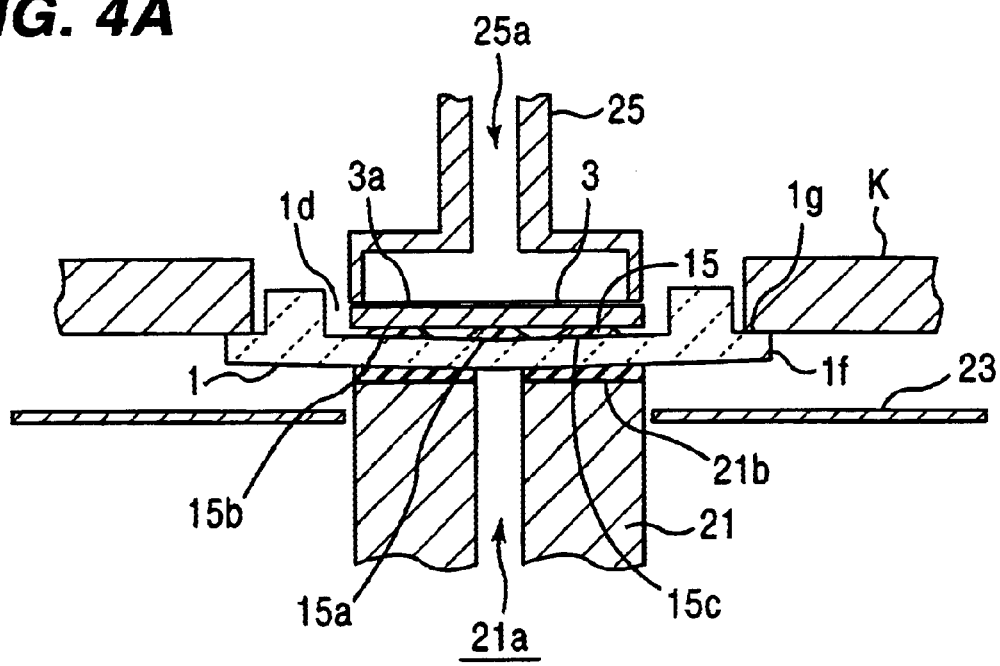
FIGS. 4A and 4B are cross-sectional views to explain an apparatus for and a method of manufacturing a solid-state image pickup device in another embodiment according to the present invention.
Figure 4B:
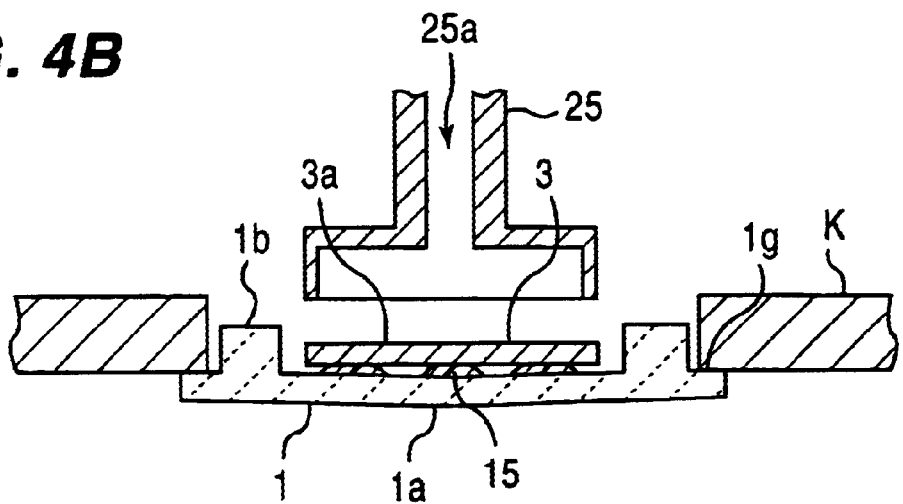

FIGS. 4A and 4B show states of the package 1 including parts with insufficient precision. The bottom plate 1a has insufficient flatness.

As shown in FIG. 4A, the bottom plate 1a of the package 1 includes a right-side section slightly projected downward compared to that of a left-side section.

The collet(collets) 25 with the solid-state image pickup element 3 is moved downward to depress the adhesive 15 by the rear surface of the element 3 to install the element 3 in the housing section 1d of the package 1. The rear surface of the element 3 however is separated from the bottom surface of the bottom plane 1a of the package 1.

High parallelism exists between the upper surface reference member K and the end edge surface 25b of the collet 25, namely, the surface of the element 3. Therefore, in the state shown in FIG. 4A, the adhesive 15b on the left side is expanded in a wider area as compared with the other adhesive 15a and 15c. The adhesive 15b resultantly becomes thinner. The insufficiency of flatness of the bottom surface of the bottom plate 1a is absorbed by the elastic adhesive 15 sporadically applied onto the surface with a particular thickness. That is, the adhesive 15 is horizontally expanded between the surface of the bottom plate of the package and the rear surface of the solid-state image pickup element 3.

FIG. 4B shows a state in which after the movement of the collet 25 with the element 3 is stopped, the operation to adsorb the collet 25 is stopped and the collet 25 is removed from the element 3. In FIG. 4B, although the adhesive is considerably depressed on the left side, the backside of the element 3 is not yet brought into contact with the package 1.

Next, an adhesive curing process is carried out.

The process to cure adhesive is conducted, for example, in an electric furnace. In the furnace, heat treatment is conducted for the workpiece for about 25 minutes at 150° C. in an atmosphere of air. The heat treatment increases adhesiveness between the solid-state image pickup element 3 and the package 1 so that the element 3 is fixedly installed in the package 1.

After a wire bonding process is carried out for the workpiece, the opening section of the package 1 is covered by a shield plate to completely produce a solid-state image pickup device.

By the processes, sufficient parallelism can be retained between the reference surface and the surface of the solid-state image pickup element 3 even if the package is in an undesired state, for example, the bottom plate of the package is distorted.

Figure 5:
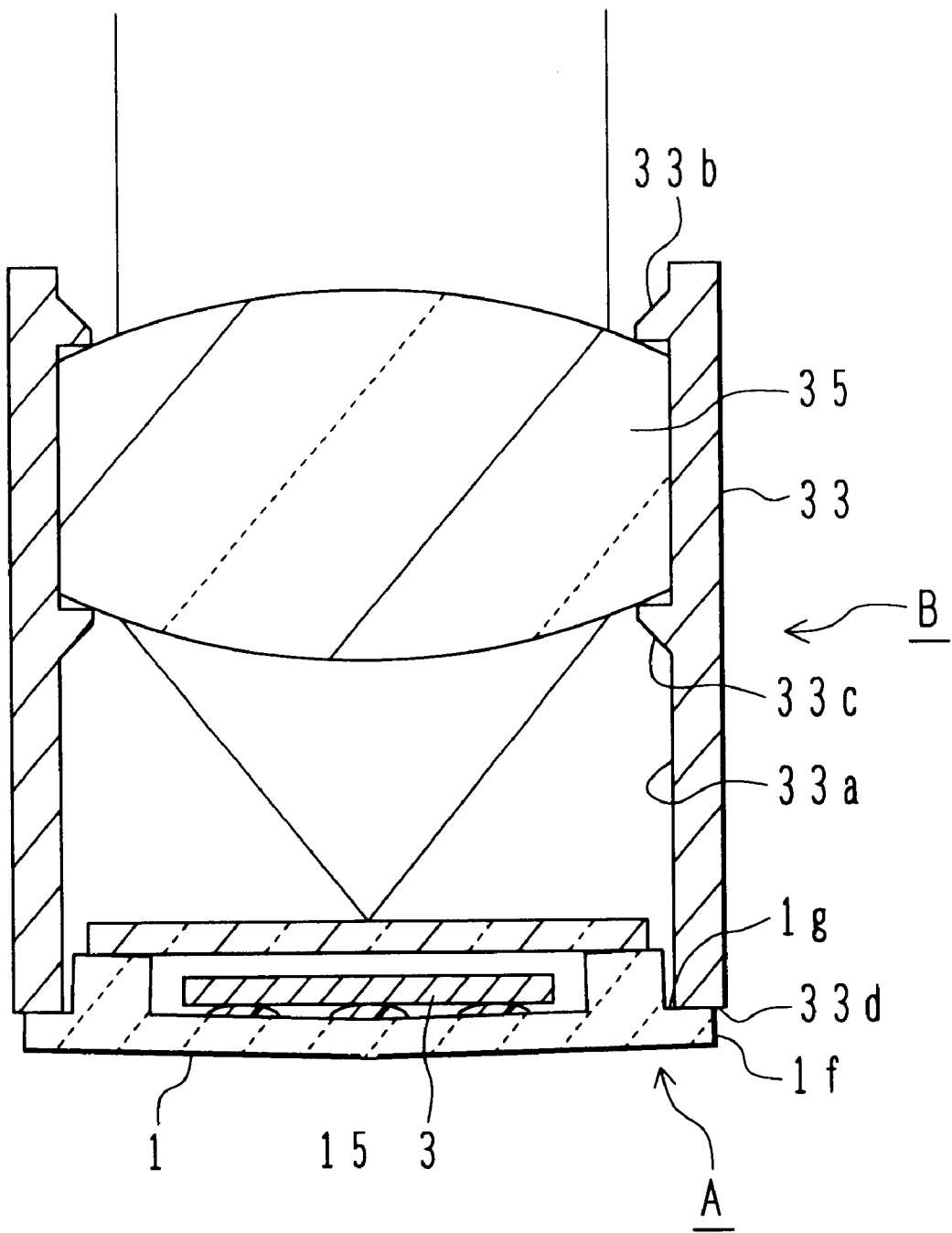
FIG. 5 is a cross-sectional view showing constitution of an optical system and a solid-state image pickup device in another embodiment according to the present invention.

FIG. 5 shows in a cross-sectional view a schematic construction of an image pickup device B including the solid-state image pickup device A shown in FIGS. 4A and 4B and an optical system including a lens.

As shown in FIG. 5, the device B includes the device A, an image pickup lens body tube 33, and an image pickup lens 35.

On an inner circumferential section 33a of the cylindrical tube 33, an upper engaging section 33b and a lower engaging section 33c are formed to support the lens 35. The lens 35 is fixedly supported by the upper and lower engaging sections 33b and 33c.

As above, parallelism of the solid-state image pickup element 3 is defined with reference to the upper surface 1g of the projection 1f of the package 1. Parallelism of the tube 33 to support the lens 35 is defined also with reference to the upper surface 1g of the projection 1f of the package 1, the upper surface 1g being brought into contact with a bottom surface 33a of the tube 33. Since the same reference surface is used for the definition of parallelism, parallelism between the element 3 and the lens 35 is also kept retained with high precision.

Figure 6:
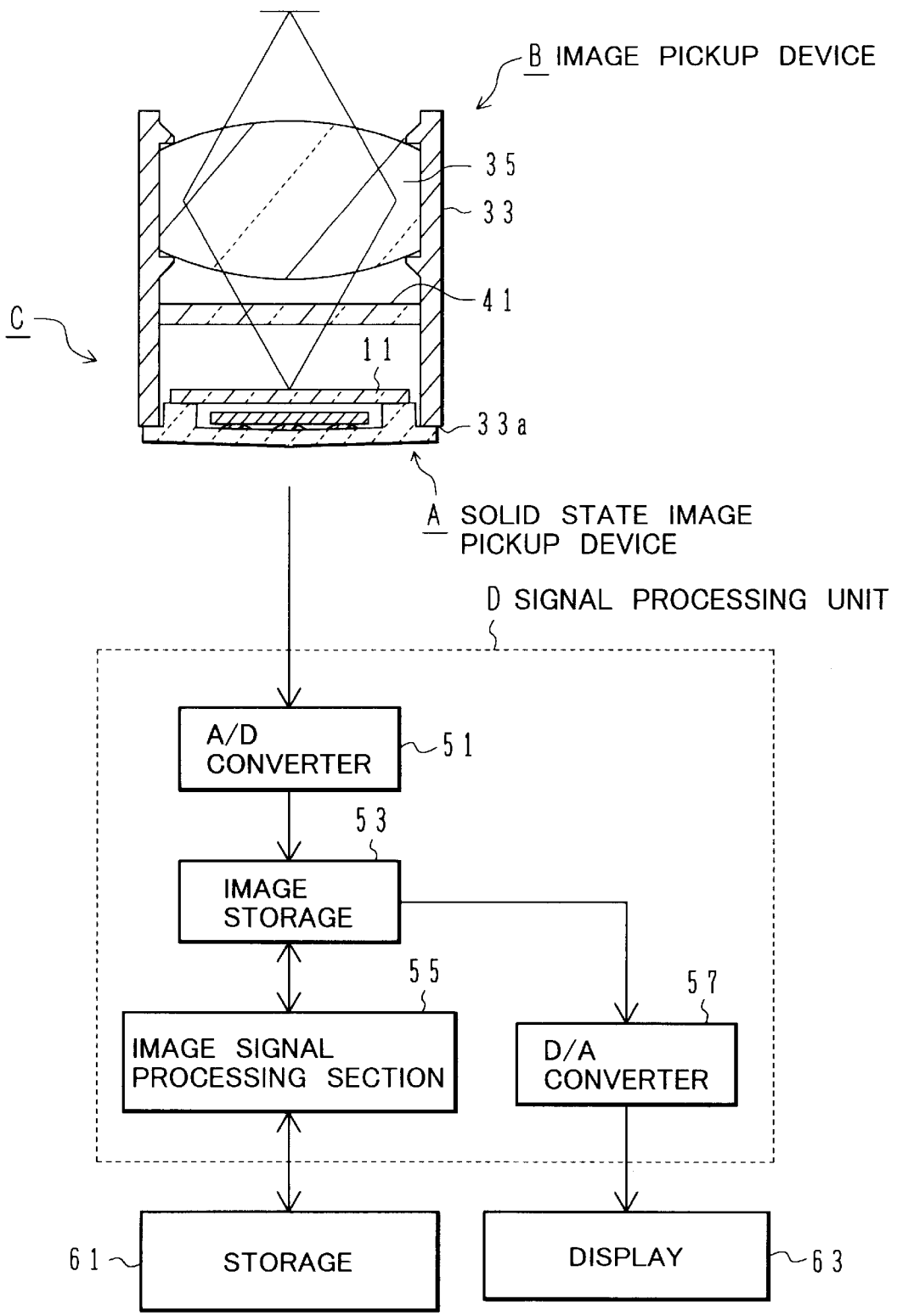
FIG. 6 is a cross-sectional view showing constitution of a solid-state image pickup device in an embodiment according to the present invention.

FIG. 6 shows a schematic configuration of a digital still camera C including the image pickup device B.

The camera C includes the device B, a signal processing unit D, a storage (image storing medium) 61, and a display (liquid crystal display, monitor display) 63.

Disposed between the lens 35 and the shield plate 11 is an infrared removing filter 41. The shielding plate 11 is, for example, a plate of crystal cut with particular orientation. The plate 11 also serves as a low-pass filter.

A signal of an image produced by the image pickup device B is processed by the signal processing unit D.

The signal processing unit D includes, for example, an analog-to-digital (A/D) converter circuit 51, an image storage 53 to store a digital signal resultant from the A/D converter 51, an image signal processing section (microprocessor) 55 to process signals stored in the image storage 53, and a digital-to-analog (D/A) converter circuit 57 to convert the digital signal in the image storage 53 into an analog signal.

The storage 61 is, for example, a semiconductor memory to store an image signal. The storage 61 is also used, for example, by another unit, for example, to reproduce an image signal.

The display 63 is, for example, a liquid crystal display which processes an image signal to reproduce an actual image. The display 63 can be used, for example, as a mobile picture monitor of a digital still camera.

In the digital still camera including the solid-state image pickup element, it is possible to minimize fluctuation of resolution of the solid-state image pickup element on the light receiving plane and hence picture quality is improved.

Next, description will be given of a variation of the first embodiment a solid-state image pickup device by referring now to the drawings.

Figure 7:
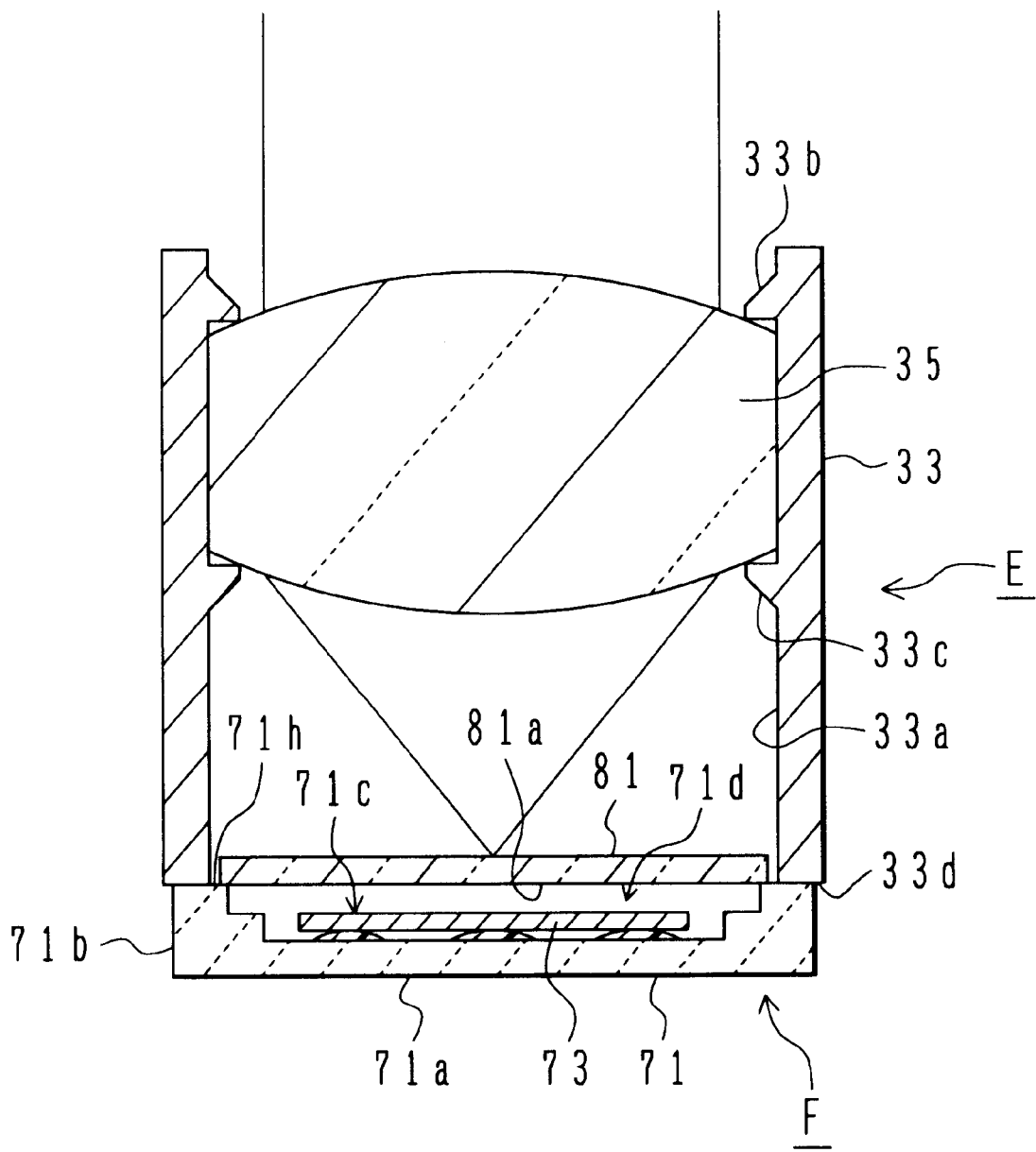
FIG. 7 is a cross-sectional view showing constitution of a variation of an optical system and a solid-state image pickup device in an embodiment according to the present invention.
Figure 8:
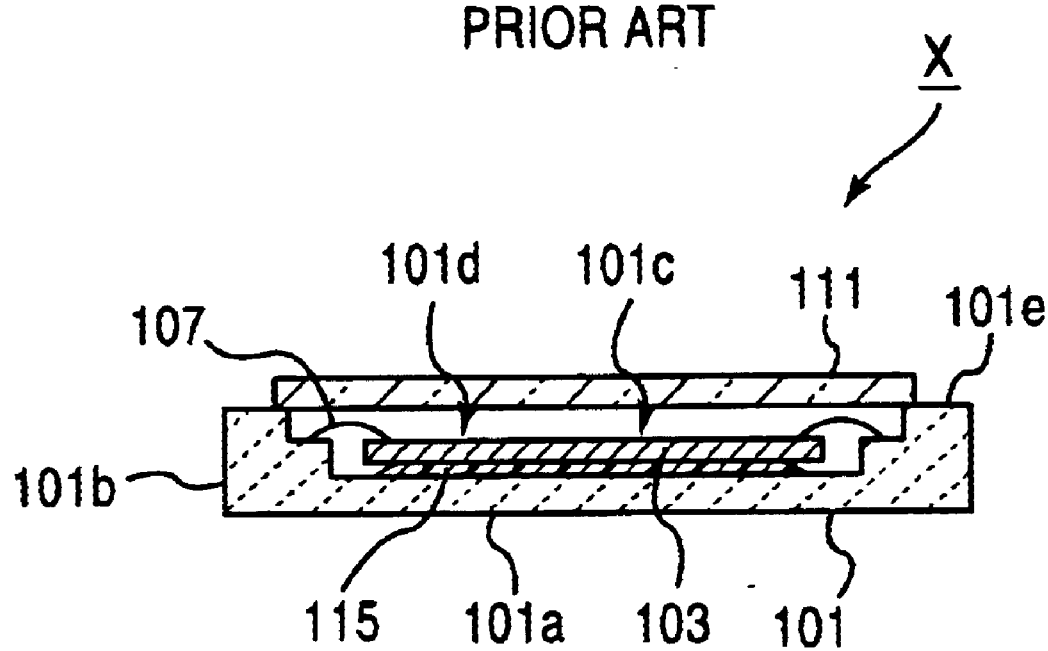
FIG. 8 is a cross-sectional view showing constitution of a general solid-state image pickup device.
Figure 9:
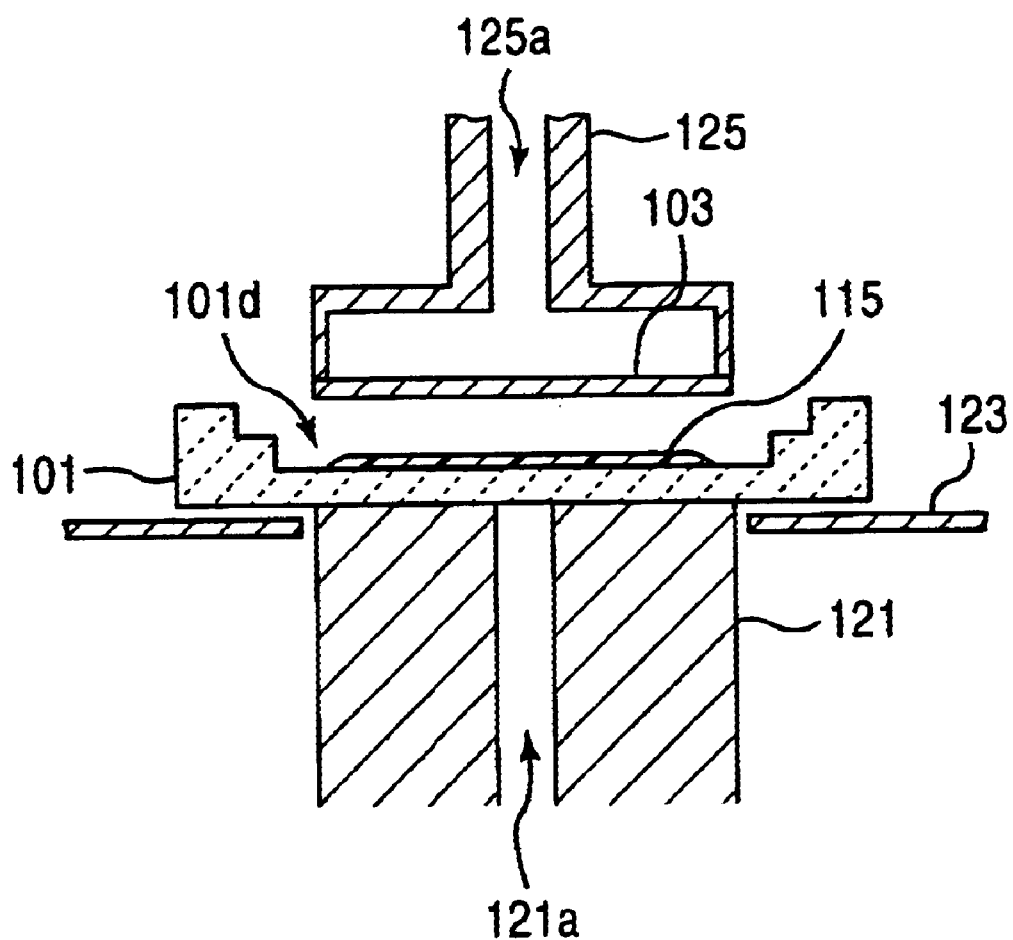
FIG. 9 is a cross-sectional view showing a process to manufacture a general solid-state image pickup device.
Figure 10:
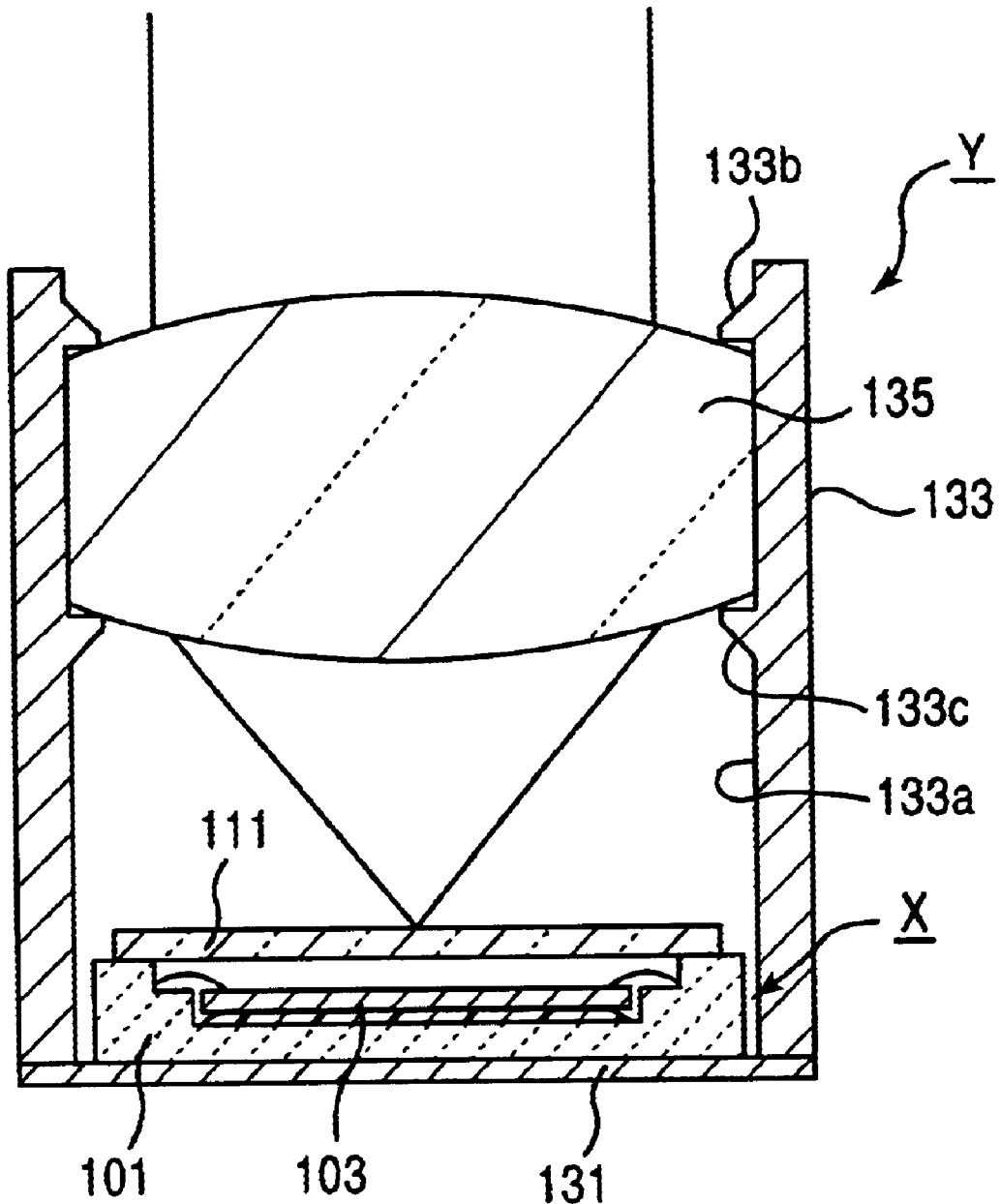
FIG. 10 is a cross-sectional view showing constitution of an image pickup device including a general solid-state image pickup device.

FIG. 7 is a schematic diagram showing an image pickup device E including a variation of the solid-state image pickup device.

As can be seen from FIG. 7, the image pickup device E includes, like the image pickup device B, a solid-state image pickup device F, an image pickup lens body tube 33, and an image pickup lens 35.

On an inner circumferential section 33a of the cylindrical tube 33, an upper engaging section 33b and a lower engaging section 33c are formed to support the lens 35. The lens 35 is fixedly supported by the upper and lower engaging sections 33b and 33c.

The image pickup device F includes a ceramic package 71 in a contour of a box and a solid-state image pickup element 73 to be housed in the package 71.

The package 71 has a contour of a box including a bottom plate 71a and a side wall section 71b rising from a peripheral section of the bottom plate 71a. The package 71 includes a housing section 71d to house the image pickup element 103. The section 71d is surrounded by an opening section 71c in an upper section of the package 71, the bottom plate 71a and the side wall section 71b. In the package 71, the side wall section 71b has no project extending to the outside.

The configuration further includes a shield plate 81 to serve as a cover of the opening section 71c. The shield plate 81 has a rear surface 81a. The rear surface 81a and a bottom surface 33d of the cylindrical body tube 33 are brought into contact with an upper surface 71h of the side wall section 71b and fixedly attached thereto.

Also in the image pickup device E using the package 71, parallelism of the solid-state image pickup element 73 is defined with reference to the upper surface 71h of the side wall section 71b of the package 71. Parallelism of the lens body tube 33 is also defined with reference to the upper surface 71h of the side wall section 71b of the package 71, the upper surface 71h being brought into contact with the rear surface 33d. Since the same reference surface is used to define parallelism, parallelism between the solid-state image pickup element 73 and the image-pickup lens 35 is also kept retained with high precision.

In the description of the embodiments, the solid-state image pickup device is manufactured using a package having lead wires. However, it is to be understood that the present invention is also applicable to a case in which lead wires are not used in the manufacturing of a solid-state image pickup device.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of manufacturing a solid-state image pickup device, comprising the steps of:

preparing a package including a housing section to house a solid-state image pickup element chip and an opening section in an upper section thereof;

sporadically and discontinuously applying an adhesive with a predetermined thickness on a bottom surface of the housing section;

moving the solid-state image pickup element toward the housing section, wherein a desired parallelism between the package and the image pickup element is defined by bringing an upper surface of the package into contact with a rear surface of a predetermined reference surface;

bringing a rear surface of the solid-state image pickup element into contact with the adhesive and stopping the movement of the element before the element comes into contact with the bottom surface of the housing section; and curing the adhesive while the solid-state image pickup element is floating on the adhesive and fixing the element in the housing section, wherein said package further comprises:
a bottom Plate and a side wall defining a space for accommodating the image pickup element chip, and
a projected section projecting outwardly from the side wall and parallel to the bottom plate, the projected section having the upper surface for defining a guide plane.

2. The method of claim 1, further comprising the steps of:

using the upper surface of the package as a reference plane to achieve parallelism between the package and the image pickup element; and disposing a lens to focus an image of an object onto a light receiving plane of the solid-state image pickup element.

3. A The method of claim 1, further comprising the step of attaching a shield plate onto the package to close the opening section.

4. The method of claim 1, wherein the adhesive applying step includes a step of applying the adhesive with a thickness ranging from 0.1 mm to 0.3 mm.

5. The method of claim 1, wherein the adhesive before the curing has a viscosity ranging from 5 Pa·s to 25 Pa·s.

6. The method of claim 1, further comprising the step of assembling a lens barrel with an imaging lens on the projected section of the package.

7. The method of claim 1, wherein said adhesive is applied randomly.

8. A method of manufacturing a solid-state image pickup device, comprising the steps of:

preparing a package including a bottom plate and a side wall rising from the bottom plate to house a solid-state image pickup element chip;

sporadically and discontinuously applying an adhesive with a predetermined thickness on the bottom plate of the package;

setting an upper surface of the package as a reference plane to achieve parallelism between the package and the image pickup element;

bringing a rear surface of the solid-state image pickup element into contact with the adhesive with parallelism adjusted between the upper surface of the element and the reference plane;

moving the solid-state image pickup element, the rear surface of the element depressing the adhesive, the rear surface of the element not coming into contact with the upper surface of the bottom plate; and curing the adhesive and fixing the solid-state image pickup element in the package, wherein
said package further comprises:
a projected section projecting outwardly from the side wall and parallel to the bottom plate, the projected section having the upper surface for defining the reference plane.

9. The method of claims 8, further comprising the step of attaching a shield plate in at least a portion of an upper surface of the side wall, the shield plate sealing the package.

10. The method of claim 8, further comprising the step of bringing the reference plane into contact with a rear surface of a lens fixing member to fix a lens to focus an image of an object onto a light receiving surface of the solid-state image pickup element and fixing the upper surface of the projected section onto the rear surface of a lens fixing member.

11. The method of claim 8, wherein the adhesive applying step includes a step of applying the adhesive with a thickness ranging from 0.1 mm to 0.3 mm.

12. The method of claim 8, wherein the adhesive before the curing has a viscosity ranging from 5 Pa·s to 25 Pa·s.

13. The method of claim 8, further comprising the step of assembling a lens barrel with an imaging lens on the projected section of the package.

14. The method of claim 8, wherein said adhesive is applied randomly.

* * * * *